US006280183B1

(12) United States Patent
Mayur et al.

(10) Patent No.: US 6,280,183 B1
(45) Date of Patent: *Aug. 28, 2001

(54) SUBSTRATE SUPPORT FOR A THERMAL PROCESSING CHAMBER

(75) Inventors: Abhilash Mayur, Sunnyvale, CA (US); Lewis A. Stern, Williston, VT (US); Anthony White, Cupertino, CA (US)

(73) Assignee: Applied Materials, Inc., Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/053,290

(22) Filed: Apr. 1, 1998

(51) Int. Cl.[7] .................................................... F27D 5/00
(52) U.S. Cl. .......................... 432/258; 432/253; 432/259
(58) Field of Search .................................. 432/253, 258, 432/259, 241; 392/416, 418; 118/724, 725

(56) References Cited

U.S. PATENT DOCUMENTS

| 698,031 | 4/1902 | Leslie . |
| 1,850,684 | 3/1932 | Nathan . |
| 3,622,427 | 11/1971 | Kelly . |
| 4,770,630 | 9/1988 | Akimoto et al. . |
| 5,316,472 | 5/1994 | Niino et al. . |
| 5,429,498 | * 7/1995 | Okase et al. .......................... 432/253 |
| 5,431,561 | 7/1995 | Yamabe et al. . |
| 5,482,559 | 1/1996 | Imai et al. . |
| 5,492,229 | * 2/1996 | Tanaka et al. ........................ 432/258 |
| 5,556,275 | 9/1996 | Sakata et al. . |
| 5,678,989 | * 10/1997 | Okase .................................. 432/253 |
| 5,820,367 | * 10/1998 | Osawa ................................. 432/253 |
| 5,848,889 | * 12/1998 | Tietz et al. ........................... 432/258 |

* cited by examiner

Primary Examiner—Jiping Lu
(74) Attorney, Agent, or Firm—Pennie & Edmonds, LLP

(57) ABSTRACT

A substrate support, such as an edge ring, includes an inner portion, and an outer portion contiguous with the inner portion and extending radially outward therefrom. The inner portion has a raised annular extension forming a ridge for supporting a substrate.

1 Claim, 5 Drawing Sheets

SUBSTRATE SUPPORT FOR A THERMAL PROCESSING CHAMBER

BACKGROUND

This invention relates to a substrate support for a thermal processing chamber.

In many semiconductor device manufacturing processes, the required high levels of device performance, yield, and process repeatability can only be achieved if the temperature of the substrate (e.g., a semiconductor wafer) is tightly monitored and controlled during processing of the substrate.

Rapid thermal processing (RTP), for example, is used for several different fabrication processes, including rapid thermal annealing (RTA), rapid thermal cleaning (RTC), rapid thermal chemical vapor deposition (RTCVD), rapid thermal oxidation (RTO), rapid thermal nitridation (RTN), and rapid thermal silicidation (RTS). The temperature in an RTP chamber may exceed 1100° C. and is subject to rapid change, thereby making precise control of the substrate temperature more complicated and more difficult.

Additionally, although it is desirable to provide a substantially uniform temperature throughout the substrate during many manufacturing processes, the support on which the substrate rests can affect the manufacturing system's ability to achieve such uniformity. In susceptorless systems, for example, the substrate is usually only supported around its perimeter with an edge ring. In some situations, however, the edge ring acts as a thermal load which removes heat from the edge of the substrate, thereby making it difficult to provide a uniform temperature across the substrate and interfering with the temperature measurements.

SUMMARY

In general, in one aspect, a substrate support includes an inner portion, and an outer portion contiguous with the inner portion and extending radially outward therefrom. The inner portion includes a raised annular extension for supporting a substrate. In one implementation, the substrate support is an edge ring.

In another aspect, a method of processing a substrate in a thermal process chamber includes supporting the substrate on an edge ring within the chamber. The edge ring includes an inner portion and an outer portion contiguous with the inner portion and extending radially outward therefrom. The inner portion includes an annular ridge for supporting the substrate.

Various implementations include one or more of the following features. The inner portion can include a substantially flat surface formed in a first plane and the outer portion can include a substantially flat surface formed in a second plane. The annuler extension can extend from the first plane toward the second plane.

The inner portion can be annular-shaped with an inner radius and an outer radius larger than the inner radius. The raised extension can form a ridge along the inner radius.

An upstanding structure can connect the inner and outer portions to retain the substrate on the ridge. The ridge can have a height less than the height of the upstanding structure, and the height of the upstanding structure can be at least as great as the combined height of the ridge and a nominal thickness of the substrate.

The ridge can be substantially parallel to the upstanding structure and can be located at an inner diameter less than the diameter of the substrate. In some implementations, the ridge has a radial width equal to or less than approximately 0.015 inches and a height of at least approximately 0.020 inches above an upper surface of the inner portion. The foregoing dimensions are suitable for use with 8-inch (200 mm) substrates in certain processing chambers, such as the RTP Centura™ or the RTP Centura XE™, manufactured by Applied Materials, Inc. Other dimensions may be suitable for wafers of different sizes, for example, a 6-inch (150 mm) or a 12-inch (300 mm) semiconductor wafer, or for different wafer processing systems.

The substrate support can include silicon or silicon carbide and can be disposed in a thermal processing chamber. A process gas can be provided in the chamber. Additionally, the chamber can be heated, and the substrate support and the substrate can be spun about a central axis during heating.

Various implementations include one or more of the following advantages. A substrate support with the raised extension or ridge provides a substantially uniform contact area with the semiconductor substrate regardless of the precise position of the substrate on the support. Moreover, since a constant contact area can be formed near substantially the entire perimeter of the substrate, the difference in temperature from one radial slice of the substrate to another is reduced. Thus, a more uniform temperature can be obtained across the substrate surface. As a result, better control over thermal processing of substrates can be provided and the likelihood of substrate breakage due to thermal gradients across the substrate can be reduced.

The substrate support also can provide the capability of transferring heat to and from the entire substrate in a repeatable fashion, thereby resulting in less variation in the processing of one substrate to the next. The configuration of the substrate support still allows the substrate to remain within the inner portion of the substrate support when the support is rotated during substrate processing.

The distance between the substrate and a reflector beneath the substrate can be kept constant with respect to edge rings in existing systems by providing the new edge ring with a relatively deep pocket for retaining the substrate. In this manner, the edge ring can be used in existing systems without requiring significant adjustment of other system components to compensate for the presence of the new raised edge.

Additional features and advantages will be readily apparent from the following detailed description, drawings and claims.

DETAILED DESCRIPTION

Figure 1:
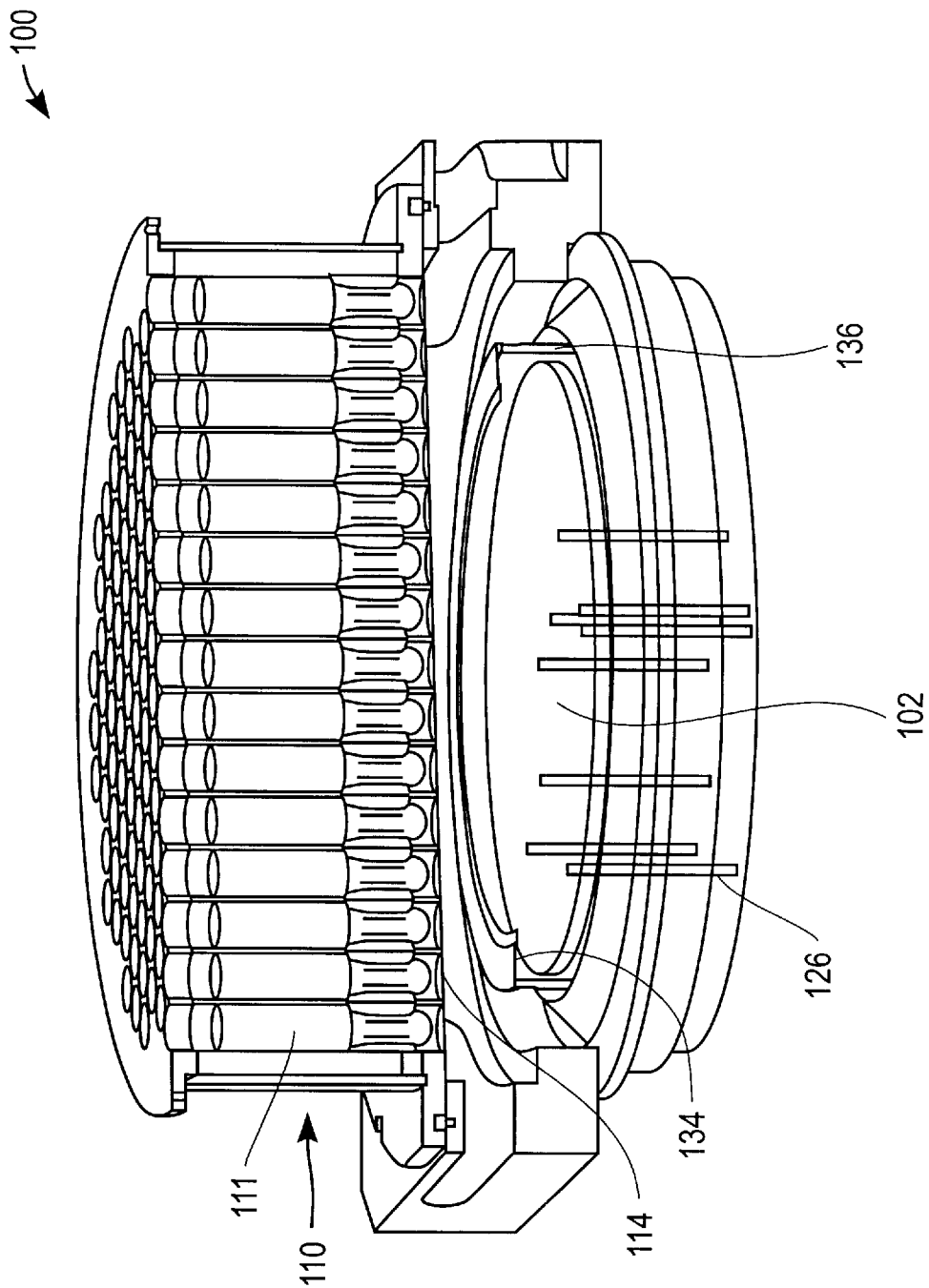
FIG. 1 is an elevated partial cross-sectional view of an RTP system according to the present invention.
Figure 2:
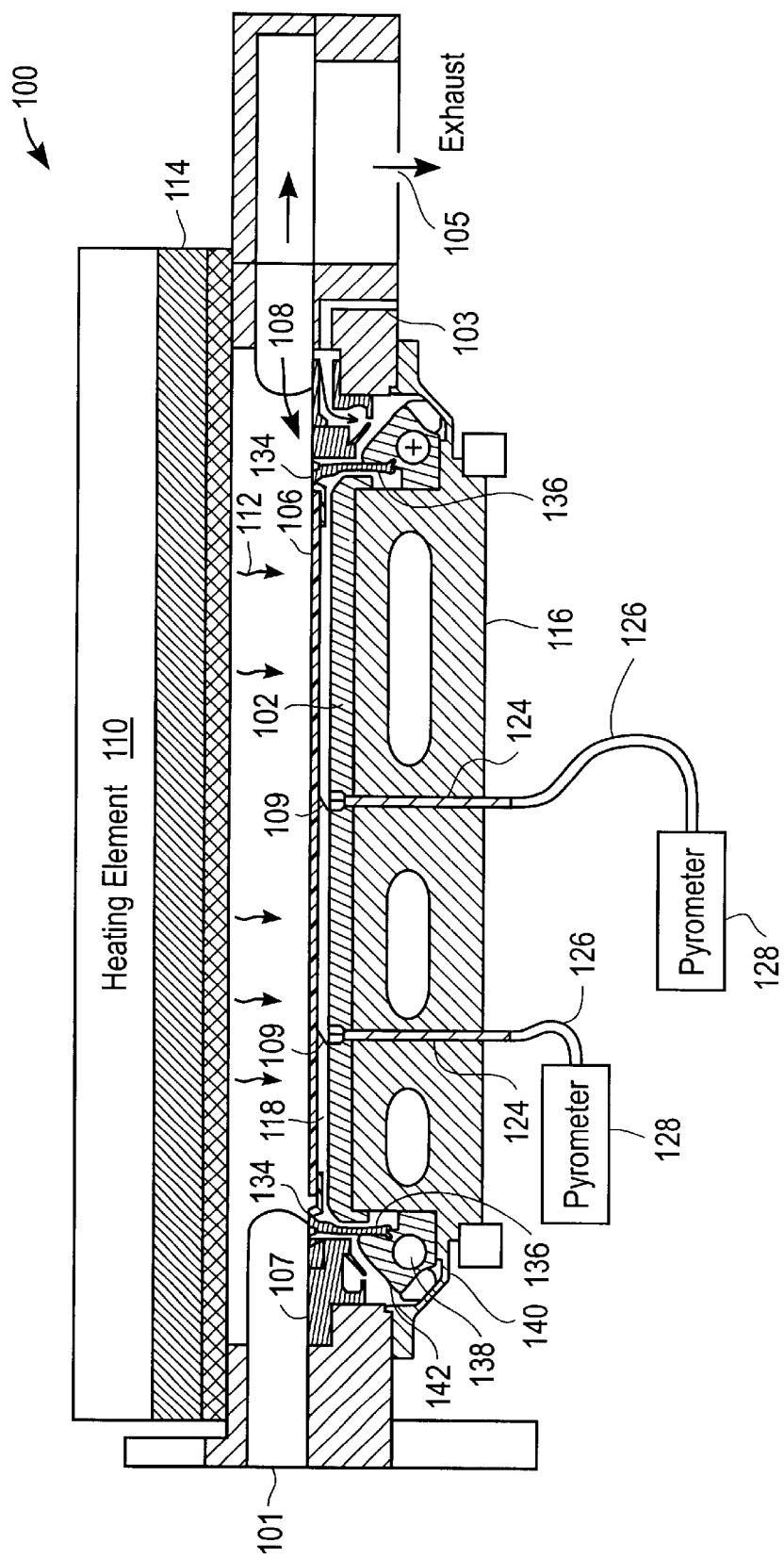
FIG. 2 is a cross-sectional side view of the RTP system according to the present invention.

FIGS. 1 and 2 illustrate a rapid thermal processing (RTP) system including a processing chamber 100 for processing a disk-shaped silicon substrate 106. Various features of the RTP system are described in further detail in co-pending U.S. patent application Ser. No. 08/641,477, entitled "Method and Apparatus for Measuring Substrate Temperatures", filed on May 1, 1996, which is incorporated herein by reference.

The substrate 106 is mounted inside the chamber on a substrate support structure 108 and is heated by a heating element 110 located directly above the substrate. The heating element 110, which can include tungsten (W) halogen lamps 111, generates radiation 112 which enters the processing chamber 100 through a water-cooled quartz window assembly 114 disposed above the substrate. The lamps 111 can be arranged in multiple zones which are grouped together in several control groups. A temperature control algorithm is used to control lamps and thereby to control the temperature. Beneath substrate 106 is a reflector 102 which is mounted on a water-cooled, stainless steel base 116. The reflector 102 can be made of aluminum and has a highly reflective surface coating. The underside of substrate 106 and the top of reflector 102 form a reflecting cavity 118 for enhancing the effective emissivity of the substrate, thereby improving the accuracy of temperature measurement.

The temperatures at localized regions 109 of the substrate 106 are measured by a plurality of temperature probes 126 and pyrometers 128. The temperature probes 126, which can include fiber-optic probes, are distributed at varying distances from the center of the substrate 106.

During thermal processing, the support structure 108 is rotated, for example, at about 90 revolutions per minute. Thus, each probe samples the temperature profile of a corresponding annular ring area on the substrate. The support structure which rotates the substrate includes an edge ring 134 which contacts the substrate around the substrate's outer perimeter, thereby leaving all of the underside of the substrate exposed except for a small annular region near the substrate's edge. To minimize the thermal discontinuities that may occur at the edge of the substrate 106 during processing, the edge ring 134 can be made of the same, or similar, material as the substrate, for example, silicon or silicon carbide coated with silicon or an oxide of silicon.

The edge ring 134 rests on a rotatable tubular quartz cylinder 136 that is coated with silicon to render it opaque in the frequency range of pyrometers 128. The silicon coating on the quartz cylinder acts as a baffle to block out radiation from external sources that might disturb the temperature measurements. The bottom of the quartz cylinder is held by an annular upper bearing race 142 which rests on a plurality of ball bearings 138 that are, in turn, held within a stationary, annular, lower bearing race 140.

During processing, a process gas is introduced into the space between the substrate 106 and the water-cooled quartz window assembly 114 through an inlet port 101. Gases are exhausted through an exhaust port 105 coupled to a vacuum pump (not shown).

An optional purge ring 107 is fitted into the chamber body and surrounds the quartz cylinder 136. The purge ring 107 has an internal annular cavity which opens to a region above the upper bearing race 142. The internal cavity is connected to a regulated purge gas supply through a passageway 103. During process steps that include providing a process gas into the upper portion of the chamber 100, a flow of purge gas enters the chamber through the purge ring 107.

Figure 3:
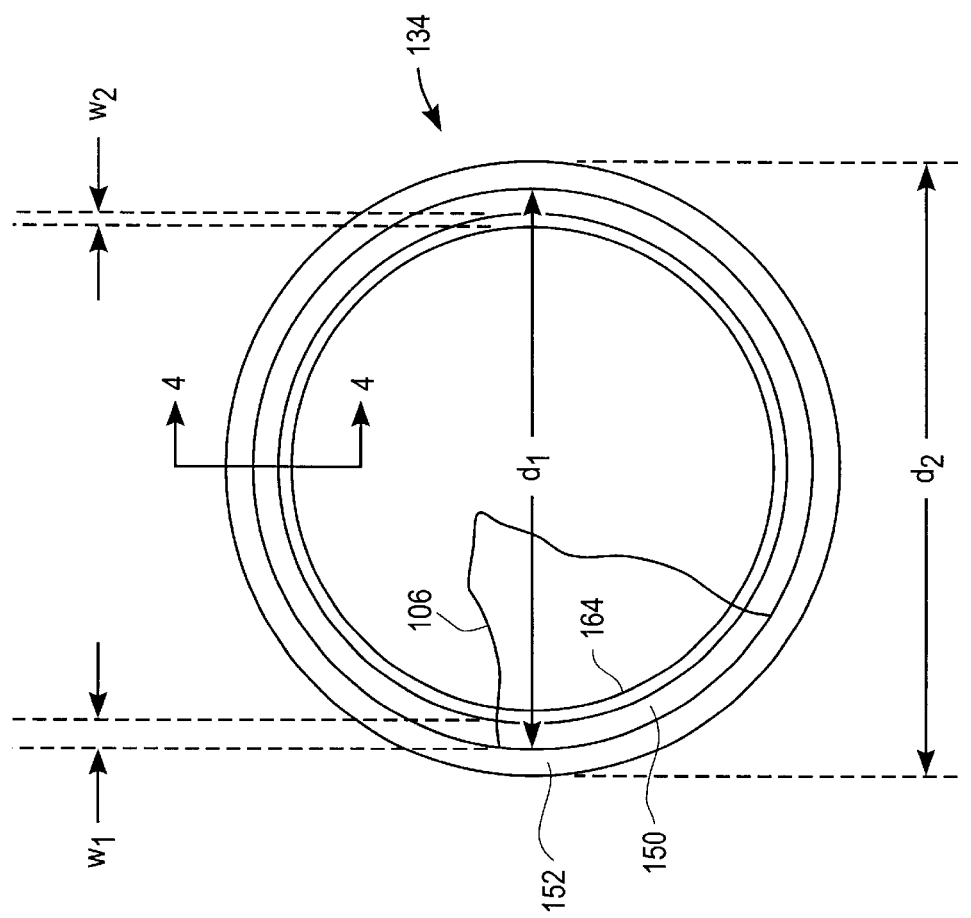
FIG. 3 is a plan view of an exemplary edge ring, not drawn to scale, according to the present invention.
Figure 4:
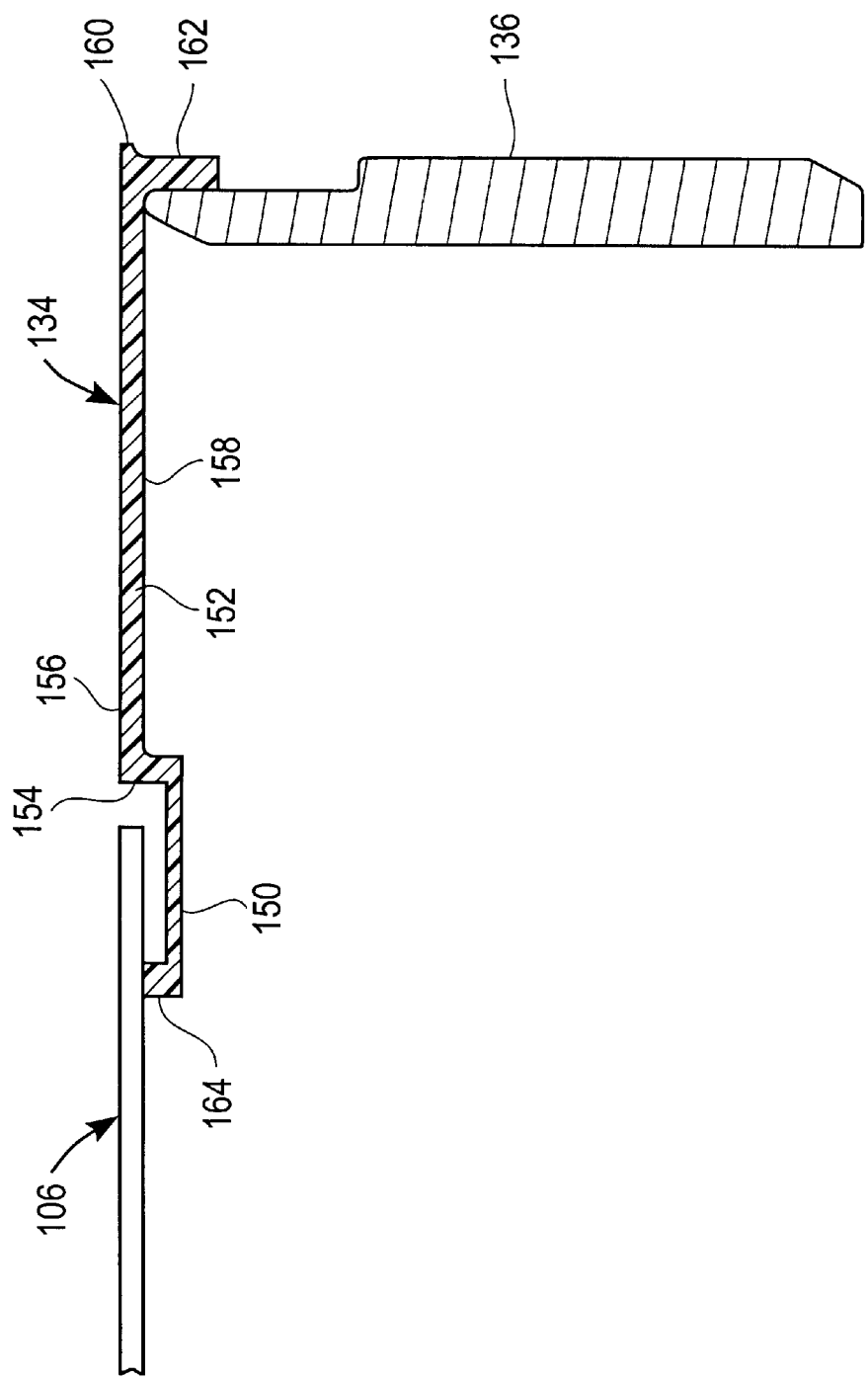
FIG. 4 is a cross-sectional side view of the edge ring of FIG. 3, not drawn to scale, along line 4—4.
Figure 5:
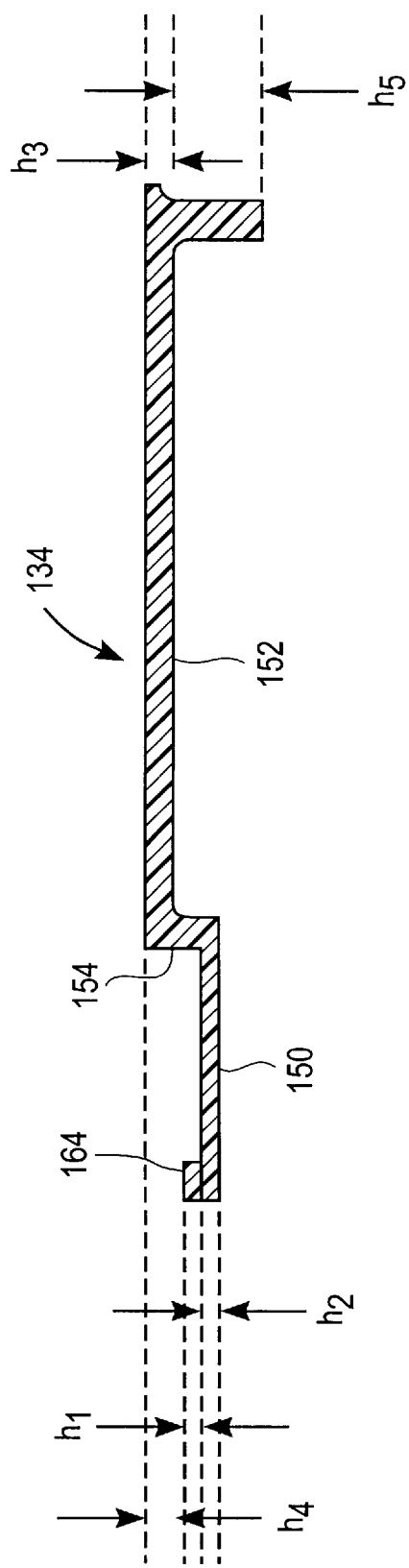
FIG. 5 is a cross-sectional side view of the edge ring of FIG. 3, not drawn to scale, showing various dimensions of the edge ring.

Referring to FIGS. 3–5, the edge ring 134, which is supported by the quartz cylinder 136, has an inner portion forming a substantially flat ledge with a raised extension 164 on its upper surface adapted to support a substrate 106. The raised extension 164 forms a ridge along the inner radius of the inner portion 150. The ridge 164 extends a height $h_1$ above the upper surface of the inner portion 150. In the illustrated implementation, which is suitable for use with 200 mm substrates, $h_1$ is approximately 0.020 inches (0.508 mm). However, when used in other processing systems, greater heights may be appropriate. Similarly, the dimensions discussed above can be scaled appropriately for use with larger or smaller substrates, such as 300 mm substrates.

An outer portion 152 of the edge ring 134 is supported from underneath by the cylinder 136. The transition between the inner portion 150 and the outer portion 152 forms an inward facing, upstanding surface 154 that keeps the substrate 106 contained in the pocket of the edge ring 134 during processing. A 200 mm substrate 106 has a diameter of approximately 7.874 inches (200 mm), plus or minus 0.040 inches (1.0 mm), and a thickness of approximately 0.03 inches (0.775 mm), plus or minus 0.001 inch (0.025 mm). Such a substrate is sometimes referred to as an 8-inch substrate. The upstanding surface 154 is designed to be at least as high as the combined height of the ridge 164 and the thickness of a substrate 106 to make sure that the substrate 106 does not slip off the edge ring 134 when the support structure 108 and substrate spin. To allow for fabrication tolerances and variations in the thicknesses of different substrates, the illustrated implementation has an upstanding surface 154 that is about 0.005 inches (0.127 mm) taller than the nominal combined height of the ridge 164 and substrate 106. The outer portion 152 of the edge ring 134 in the illustrated implementation has a substantially flat upper surface 156 that is at the same elevation as the top of the upstanding surface 154 to allow smooth flow of process gases across the surface. In the illustrated implementation, the outer diameter $d_2$ of the outer portion 152 is approximately 9.257 inches (235 mm).

The relative heights of the ridge 164 and the upstanding surface 154, as well as the thickness of the inner portion 150, can be selected so that the distance from the bottom of the substrate 106 to the reflector 102 beneath the substrate remains substantially constant with respect to existing RTP systems. Forming the edge ring 134 with such dimensions allows the edge ring to be used in the existing systems without requiring numerous adjustments to other components of the system. In the illustrated implementation, for example, the thickness $h_2$ of the inner portion 150 is approximately 0.015 inches (0.381 mm), and the thickness $h_3$ of the outer portion 152 is approximately 0.017 inches (0.432 mm). The upstanding surface 154 extends a height $h_4$ above the top of the ridge 164. In the illustrated implementation, the height $h_4$ is approximately 0.035 inches (0.9 mm).

The inner portion 150 should be sufficiently broad so that the raised extension 164 supports the substrate 106 around or near its entire perimeter to provide a light seal. In the illustrated implementation, the outer diameter $d_1$ of the inner portion 150 is approximately 7.987 inches (203 mm). The radial width $w_1$ of the inner portion 150, excluding the radial width of the ridge 164, is approximately 0.162 inches (4.115 mm). The ridge 164 has a radial width $w_2$ of approximately 0.015 inches (0.381 mm), and the ridge is located at an inner diameter less than the diameter of the substrate 106. Radial widths greater or less than 0.015 inches (0.381 mm) also can be used for the ridge. However, the dimensions should be selected to ensure that if a substrate 106 is positioned off-center on the ridge 164, a gap will not be formed between the ridge 164 and one side of the substrate. Such a gap could allow light to leak into the cavity 118.

The support structure 108 also is designed to create a light seal between the edge ring 134 and the quartz cylinder 136.

The bottom of the edge ring 134, near its outer edge 160, forms an annular-shaped shoulder 162 which has an inside diameter that is slightly larger than the outside diameter of the quartz cylinder 136, so that it fits over the cylinder forming a light seal. In the illustrated implementation, the height $h_5$ of the shoulder 162 is approximately 0.087 inches (2.21 mm).

The illustrated implementation of FIGS. 3–5 is formed by grinding a disk of chemical vapor deposited (CVD) silicon carbide with a diamond grinding head. Exterior corners are fully rounded and interior corners are rounded to a radius of at least approximately 0.01 inches (0.25 mm) to reduce mechanical stresses in the edge ring 134. The entire edge ring 134 can be coated with approximately 0.004 inches (0.1 mm) of silicon on each side. In various implementations, layers of different or additional materials also can be added to the edge ring.

Other implementations are within the scope of the following claims. Thus, for example, although the invention has been described in the context of an edge ring support, it also can be used for other wafer support or platform designs. Similarly, the foregoing dimensions are suitable for use of the edge ring 134 in certain processing chambers, such as the RTP Centura™ or the RTP Centura XE™, manufactured by Applied Materials, Inc. Other dimensions may be suitable for wafers of different sizes, for example, a 6-inch (150 mm) or a 12-inch (300 mm) semiconductor wafer, or for wafer processing systems different from the RTP system described above.

What is claimed is:

1. A single substrate RTP reaction chamber in which a reflective cavity is formed between a substrate placed in the chamber and a reflective surface below the substrate, wherein the chamber includes an edge ring for supporting the substrate near its periphery, the edge ring comprising: an open center region such that a major portion of the substrate surface is exposed to radiation reflected from the reflective surface during processing; an inner annular-shaped portion including a substantially flat surface formed in a first plane; an outer annular-shaped portion contiguous with the inner annular-shaped portion, wherein the outer portion includes a substantially flat surface extending radially outward from the inner portion in a second plane, the inner annular-shaped portion further including a raised annular ridge proximate its inner edge, the ridge extending from the first plane toward the second plane to support the substrate at its periphery and provide a substantially uniform thermal contact surface proximate the periphery of the substrate to reduce temperature differentials across the substrate surface, and an upstanding annular-shaped structure connecting the inner and outer annular-shaped portions so as to retain the substrate on the ridge, wherein the upstanding structure has a height greater than the combined height of the ridge and a nominal thickness of the substrate.

\* \* \* \* \*